United States Patent
Shih et al.

(10) Patent No.: US 8,679,252 B2
(45) Date of Patent: *Mar. 25, 2014

(54) ACTIVELY HEATED ALUMINUM BAFFLE COMPONENT HAVING IMPROVED PARTICLE PERFORMANCE AND METHODS OF USE AND MANUFACTURE THEREOF

(75) Inventors: Hong Shih, Walnut, CA (US); G. Grant Peng, Fremont, CA (US); Daxing Ren, Pleasanton, CA (US)

(73) Assignee: Lam Research Corporation, Fremont, CA (US)

( * ) Notice: Subject to any disclaimer, the term of this patent is extended or adjusted under 35 U.S.C. 154(b) by 1218 days.

This patent is subject to a terminal disclaimer.

(21) Appl. No.: 11/232,991

(22) Filed: Sep. 23, 2005

(65) Prior Publication Data

US 2007/0068629 A1   Mar. 29, 2007

(51) Int. Cl.
*C23C 16/00* (2006.01)
*C23C 16/455* (2006.01)
*C23C 16/50* (2006.01)
*H01L 21/3065* (2006.01)

(52) U.S. Cl.
USPC ............ 118/715; 118/723 R; 118/723 E; 118/724; 156/345.34

(58) Field of Classification Search
USPC .......... 118/715, 723 R, 723 E, 724, 50.1; 156/345.33, 345.34, 345.43, 345.47
See application file for complete search history.

(56) References Cited

U.S. PATENT DOCUMENTS

| | | | |
|---|---|---|---|
| 5,069,938 A | 12/1991 | Lorimer et al. | |
| 5,196,106 A * | 3/1993 | DuPree et al. | 205/67 |
| 5,277,788 A * | 1/1994 | Nitowski et al. | 205/175 |
| 5,366,585 A | 11/1994 | Robertson et al. | |
| 5,534,751 A | 7/1996 | Lenz et al. | |
| 5,705,225 A | 1/1998 | Dornfest et al. | |
| 5,756,222 A | 5/1998 | Bercaw et al. | |
| 5,811,195 A | 9/1998 | Bercaw et al. | |
| 5,959,409 A | 9/1999 | Dornfest et al. | |
| 5,975,852 A * | 11/1999 | Nagaraj et al. | 416/241 R |
| 6,073,577 A | 6/2000 | Lilleland et al. | |
| 6,415,736 B1 | 7/2002 | Hao et al. | |
| 6,432,831 B2 | 8/2002 | Dhindsa et al. | |
| 6,451,157 B1 | 9/2002 | Hubacek | |
| 6,579,439 B1 | 6/2003 | Chandler | |
| 6,592,707 B2 | 7/2003 | Shih et al. | |
| 6,647,993 B2 * | 11/2003 | Shang et al. | 134/1.1 |
| 6,824,627 B2 | 11/2004 | Dhindsa et al. | |
| 6,986,838 B2 * | 1/2006 | Babic et al. | 205/210 |

(Continued)

OTHER PUBLICATIONS

Williams, D. B. et al. "A Microchemical Study of Surface Films on Aluminum Alloy Foils for AEM," *Analytical Electron Microscopy*. San Francisco Press, Inc. pp. 69-72. 1984.

(Continued)

*Primary Examiner* — Jeffrie R Lund
(74) *Attorney, Agent, or Firm* — Buchanan Ingersoll & Rooney PC

(57) ABSTRACT

An actively heated aluminum baffle component such as a thermal control plate or baffle ring of a showerhead electrode assembly of a plasma processing chamber has an exposed outer aluminum oxide layer which is formed by an electropolishing procedure. The exposed outer aluminum oxide layer minimizes defects and particles generated as a result of differential thermal stresses experienced by the aluminum component and outer aluminum oxide layer during plasma processing compared to an identically shaped component having a Type III anodized surface.

10 Claims, 2 Drawing Sheets

(56) References Cited

U.S. PATENT DOCUMENTS

| | | | |
|---|---|---|---|
| 7,645,341 B2* | 1/2010 | Kennedy et al. | 118/715 |
| 7,811,409 B2* | 10/2010 | Egley et al. | 156/345.34 |
| 8,313,635 B2* | 11/2012 | Egley et al. | 205/640 |
| 2002/0121204 A1* | 9/2002 | Bennett et al. | 101/401.1 |
| 2002/0127853 A1 | 9/2002 | Hubacek et al. | |
| 2003/0196755 A1 | 10/2003 | Antolik | |
| 2005/0016867 A1 | 1/2005 | Kreiskott et al. | |
| 2005/0056546 A1* | 3/2005 | Kia et al. | 205/324 |
| 2005/0106884 A1 | 5/2005 | Ren | |
| 2005/0133160 A1 | 6/2005 | Kennedy et al. | |
| 2005/0284573 A1* | 12/2005 | Egley et al. | 156/345.33 |
| 2006/0254922 A1* | 11/2006 | Brevnov et al. | 205/205 |
| 2007/0068629 A1* | 3/2007 | Shih et al. | 156/345.34 |
| 2008/0178906 A1* | 7/2008 | Egley et al. | 134/1.1 |
| 2010/0319813 A1* | 12/2010 | Egley et al. | 148/285 |
| 2011/0229803 A1* | 9/2011 | Rakowski et al. | 429/535 |
| 2013/0056022 A1* | 3/2013 | Egley et al. | 134/1.1 |

OTHER PUBLICATIONS

Examination Report mailed Dec. 22, 2009 for Singapore Patent Appln. No. 200802252-7.

International Search Report, Sep. 25, 2007.

* cited by examiner

ACTIVELY HEATED ALUMINUM BAFFLE COMPONENT HAVING IMPROVED PARTICLE PERFORMANCE AND METHODS OF USE AND MANUFACTURE THEREOF

BACKGROUND

As semiconductor technology evolves, decreasing transistor sizes call for an ever higher degree of accuracy, repeatability and cleanliness in wafer processes and process equipment. Various types of equipment exist for semiconductor processing, including applications that involve the use of plasmas, such as plasma etch, plasma-enhanced chemical vapor deposition (PECVD) and resist strip. The types of equipment required for these processes include components which are disposed within the plasma chamber, and must function in that environment. The environment inside the plasma chamber may include exposure to the plasma, exposure to etchant gasses, and thermal cycling. Materials used for such components must be adapted to withstand the environmental conditions in the chamber, and do so for the processing of many wafers which may include multiple process steps per wafer. To be cost effective, such components must often withstand hundreds or thousands of wafer cycles while retaining their functionality and cleanliness. There is generally extremely low tolerance for components which produce particles, even when those particles are few and no larger than a few tens of nanometers. It is also necessary for components selected for use inside plasma processing chambers to meet these requirements in the most cost-effective manner.

SUMMARY

An actively heated aluminum baffle component such as a thermal control plate or baffle ring including an exposed outer aluminum oxide layer which is formed by an electropolishing procedure.

DETAILED DESCRIPTION

Plasma processing apparatuses for semiconductor substrates, such as silicon wafers, include plasma etch chambers which are used in semiconductor device manufacturing processes to etch such materials as semiconductors, metals and dielectrics. For example, a dielectric etch chamber might be used to etch materials such as silicon dioxide or silicon nitride. During the etch process, components within the etch chamber heat up and cool down and experience thermal stresses as a result. For actively heated components such as baffle components of a heated showerhead assembly, this temperature cycling can result in increased particle generation.

A showerhead electrode assembly having a heater to prevent the showerhead electrode from falling below a minimum temperature is described in commonly-owned U.S. Patent Publication No. 2005/0133160A1, the disclosure of which is hereby incorporated by reference. The heater cooperates with a thermal control plate in heat transfer with a temperature controlled top plate which forms a top wall of a plasma etch chamber.

Figure 1:
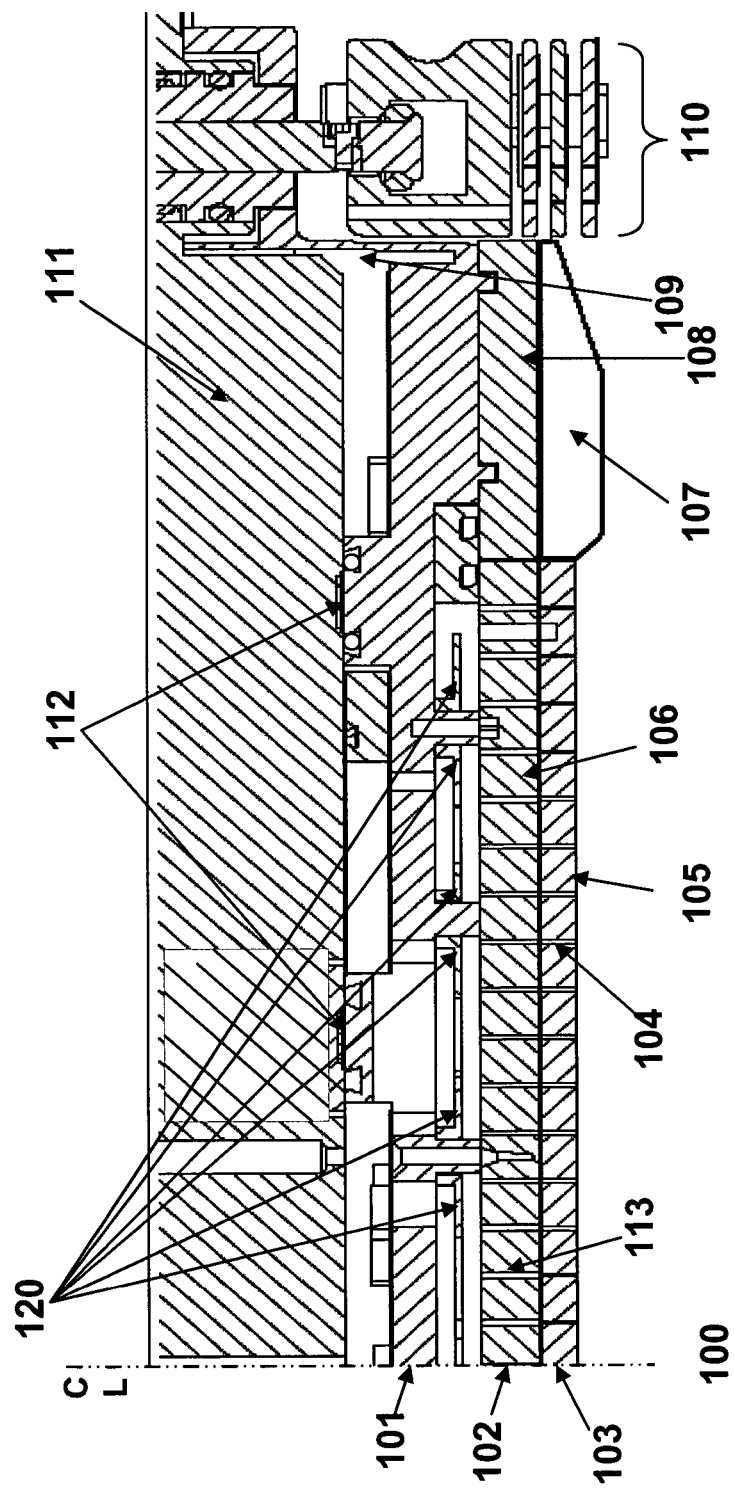
FIG. 1 depicts a schematic of a showerhead electrode assembly and actively heated aluminum baffle components.

FIG. 1 depicts one-half of a showerhead assembly 100 of a parallel plate capacitively coupled plasma chamber which comprises a top electrode 103 and an optional backing member 102 secured to the top electrode 103, a thermal control plate 101, and a top plate 111. The top plate 111 can form a removable top wall of the plasma processing apparatus, such as a plasma etch chamber. The top electrode 103 preferably includes an inner electrode member 105, and an optional outer electrode member 107. The inner electrode member 105 is preferably a cylindrical made of single crystal silicon. If desired, the inner and outer electrodes 105, 107 can be made of a single piece of material such as CVD silicon carbide, single crystal silicon or other suitable material.

The inner electrode member 105 can have a diameter smaller than, equal to, or larger than a wafer to be processed, e.g., up to 200 mm if the plate is made of single crystal silicon, which is the maximum diameter of currently available single crystal silicon material. For processing larger semiconductor substrates such as 300 mm wafers, the outer electrode member 107 is adapted to expand the diameter of the top electrode 103 from about 15 inches to about 17 inches. The outer electrode member 107 can be a continuous member (e.g., a poly-silicon or silicon carbide member, such as a ring), or a segmented member (e.g., 2-6 separate segments arranged in a ring configuration, such as segments of single crystal silicon). In embodiments wherein the top electrode 103 includes a multiple-segment outer electrode member 107, the segments preferably have edges which overlap each other to protect an underlying bonding material from exposure to plasma. The inner electrode member 105 preferably includes multiple gas passages 104 for injecting a process gas into a space in a plasma reaction chamber below the top electrode 103. The outer electrode 107 preferably forms a raised step at the periphery of the electrode 103. Further details of a stepped electrode can be found in commonly-owned U.S. Pat. No. 6,824,627, the disclosure of which is hereby incorporated by reference.

Single crystal silicon is a preferred material for plasma exposed surfaces of the inner electrode member 105 and the outer electrode member 107. High-purity, single crystal silicon minimizes contamination of substrates during plasma processing as it introduces only a minimal amount of undesirable elements into the reaction chamber, and also wears smoothly during plasma processing, thereby minimizing particles.

The showerhead electrode assembly 100 can be sized for processing large substrates, such as semiconductor wafers having a diameter of 300 mm. For 300 mm wafers, the top electrode 103 is at least 300 mm in diameter. However, the showerhead electrode assembly can be sized to process other wafer sizes or substrates having a non-circular configuration.

The backing member 102 includes a backing plate 106 and optionally a backing ring 108. In such configurations, the inner electrode member 105 is co-extensive with the backing plate 106, and the outer electrode member 107 is co-extensive with the surrounding backing ring 108. However, the backing plate 106 can extend beyond the inner electrode member such that a single backing plate can be used to support the inner electrode member and the segmented outer electrode member or the inner electrode and outer electrode can comprise a single piece of material. The inner electrode member 105 and the outer electrode member 107 are preferably attached to the backing member 102 by a bonding material, such as an elastomeric bonding material. The backing plate 106 includes gas passages 113 aligned with the gas passages 104 in the inner electrode member 105 to provide gas flow into the plasma processing chamber. The gas passages 113 can typically have a diameter of about 0.04 inch, and the gas passages 104 can typically have a diameter of about 0.025 inch.

The backing plate 106 and backing ring 108 are preferably made of a material that is chemically compatible with process gases used for processing semiconductor substrates in the plasma processing chamber, have a coefficient of thermal expansion closely matching that of the electrode material, and/or are electrically and thermally conductive. Preferred materials that can be used to make the backing member 102 include, but are not limited to, graphite and SiC.

The top electrode 103 can be attached to the backing plate 106 and backing ring 108 with a thermally and electrically conductive elastomer bonding material that accommodates thermal stresses, and transfers heat and electrical energy between the top electrode 103 and the backing plate 106 and backing ring 108. The use of elastomers for bonding together surfaces of an electrode assembly is described, for example, in commonly-owned U.S. Pat. No. 6,073,577, which is incorporated herein by reference in its entirety.

The backing plate 106 and the backing ring 108 are preferably attached to the thermal control plate 101 with suitable fasteners, which can be threaded bolts, screws, or the like. For example, bolts (not shown) can be inserted in holes in the thermal control plate 101 and screwed into threaded openings in the backing member 102. The thermal control plate 101 is in heat transfer relationship with an actively controlled heater. See, for example, FIGS. 1-2 and discussion thereof described in commonly-owned U.S. Published Application No. 2005/0133160A1, the disclosure of which is hereby incorporated by reference. The thermal control plate 101 includes a flexure portion 109 and is preferably made of a machined metallic material, such as aluminum, an aluminum alloy such as aluminum alloy 6061 or the like. The top plate 111 is preferably made of aluminum or an aluminum alloy such as aluminum alloy 6061. A plasma confinement assembly 110 is shown outwardly of the showerhead electrode assembly 100. A suitable plasma confinement assembly including a vertically-adjustable, plasma confinement ring assembly is described in commonly-owned U.S. Pat. No. 5,534,751, which is incorporated herein by reference in its entirety.

The thermal control plate preferably includes at least one heater operable to cooperate with the temperature-controlled top plate to control the temperature of the top electrode. For example, in a preferred embodiment, the heater is provided on the upper surface of the thermal control plate and includes a first heater zone surrounded by the first projection, a second heater zone between the first projection and the second projection, and a third heater zone between the second projection and the flexure portion. The number of heater zones can be varied; for example, in other embodiments the heater can include a single heater zone, two heater zones, or more than three heater zones. The heater can alternatively be provided on a bottom surface of the thermal control plate.

The heater preferably comprises a laminate including a resistively heated material disposed between opposed layers of a polymeric material that can withstand the operating temperatures reached by the heater. An exemplary polymeric material that can be used is a polyimide sold under the trademark Kapton®, which is commercially available from E.I. du Pont de Nemours and Company. Alternatively, the heater can be a resistive heater embedded in the thermal control plate (e.g., a heating element in a cast thermal control plate or a heating element located in a channel formed in the thermal control plate). Another embodiment of the heater includes a resistive heating element mounted on the upper and/or lower surface of the thermal control plate. Heating of the thermal control plate can be achieved via conduction and/or radiation.

The heater material can have any suitable pattern that provides for thermally uniform heating of the first heater zone, second heater zone, and third heater zone. For example, the laminate heater can have a regular or non-regular pattern of resistive heating lines such as a zig-zag, serpentine, or concentric pattern. By heating the thermal control plate with the heater, in cooperation with operation of the temperature-controlled top plate, a desirable temperature distribution can be provided across the top electrode during operation of the showerhead electrode assembly.

The heater sections located in the first heater zone, second heater zone, and third heater zone can be secured to the thermal control plate by any suitable technique, e.g., the application of heat and pressure, adhesive, fasteners, or the like.

The top electrode can be electrically grounded, or alternatively can be powered, preferably by a radio-frequency (RF) current source. In a preferred embodiment, the top electrode is grounded, and power at one or more frequencies is applied to the bottom electrode to generate plasma in the plasma processing chamber. For example, the bottom electrode can be powered at frequencies of 2 MHz and 27 MHz by two independently controlled radio frequency power sources. After a substrate has been processed (e.g., a semiconductor substrate has been plasma etched), the supply of power to the bottom electrode is shut off to terminate plasma generation. The processed substrate is removed from the plasma processing chamber, and another substrate is placed on the substrate support for plasma processing. In a preferred embodiment, the heater is activated to heat the thermal control plate and, in turn, the top electrode, when power to the bottom electrode is shut off. As a result, the top electrode temperature is preferably prevented from decreasing below a desired minimum temperature. For etching dielectric materials, the top electrode temperature is preferably maintained at approximately a constant temperature such as 150 to 250° C. between successive substrate processing runs so that substrates are processed more uniformly, thereby improving process yields. The power supply preferably is controllable to supply power at a desired level and rate to the heater based on the actual temperature and the desired temperature of the top electrode.

Figure 2:
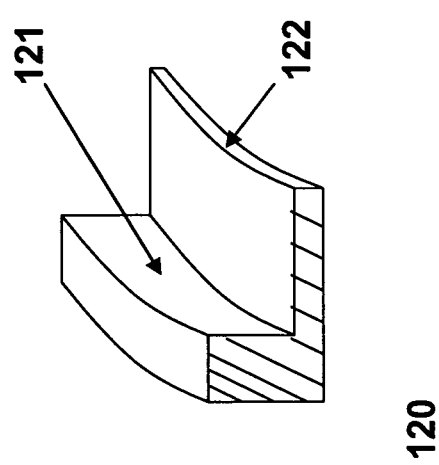
FIG. 2 depicts a cross section of one of the rings shown in FIG. 1.

Another example of an actively heated aluminum component used in a plasma processing chamber is an aluminum baffle ring arrangement 120 used to distribute process gasses in a plasma chamber. The aluminum baffle ring arrangement 120 in FIG. 1 includes six rings made from aluminum or an aluminum alloy, such as 6061 aluminum, which comprises by weight from about 96 to about 98% Al, about 0.8 to about 1.2% Mg, about 0.4 to about 0.8% Si, about 0.15 to 0.4% Cu, about 0.04 to 0.35% Cr, and optionally Fe, Mn, Zn and/or Ti. The 6 concentric L-shaped rings located within the plenums above the backing member 102 and below the thermal control plate 101. For example, a central plenum can include a single ring, the adjacent plenum can include two rings separated by a ½ to 1 inch gap, the next adjacent plenum can include two rings separated by a ½ to 1 inch gap and an outer plenum can include a single ring. The rings are mounted to the thermal control plate 101 with screws. For example, each ring can include circumferentially spaced apart stand-offs or bosses with through holes for receiving the screws, e.g., three bosses arranged 120° apart can be used. A representative cross-section of a section of a single baffle ring is shown in FIG. 2. Each ring can have a horizontal section of about 0.040 inch thickness and a vertical flange of about ¼ inch in length. The ring includes flat surfaces 121 and edges 122.

Conventional aluminum components used in a plasma processing chamber have a surface finish created by a process known as Type III anodization, which results in the formation of an aluminum oxide layer approximately 25-75 micrometers thick. Type III anodization (also called "hard" anodization) is carried out in an electrolytic bath which includes sulfuric acid at a concentration of about 14-17% by wt. and optionally oxalic acid at a concentration of about 2.5-7.5% by wt. The bath is maintained at a temperature of about −4° C. to 11° C. and the workpiece is maintained as the anode of an electrolytic cell at a voltage of about 50V to 75V for about 10-80 minutes. The resulting layer consists of primarily aluminum oxide and comprises about 1000 A (0.1 micrometer) of dense aluminum oxide near the Al/oxide interface and the remaining thickness of porous oxide. Baffle rings with an anodized layer exhibit cracking and cause particle contamination as a result of temperature cycling between ambient and elevated temperatures exceeding 100° C., 125° C., 150° C., 175° C., 200° C. or higher.

During processing of a semiconductor substrate in the processing chamber, heat is transferred to the thermal control plate and baffle rings from the heater arrangement or from heat generated by the inner electrode member 105 and the outer electrode member 107. As a result of this heat transfer, the temperature of components such as the thermal transfer plate aluminum baffle rings 120 may be actively heated to temperatures of 150° C., 160° C., 170° C., 180° C., 190° C., 200° C. or higher. Thus, the actively heated aluminum baffle component can be thermally cycled over temperature cycles from ambient to 150° C. and above. Relative values of thermal expansion coefficients α of the bulk material and the surface oxide material of aluminum components therefore will be stressed under normal processing conditions. The thermal expansion coefficient α for aluminum is about $25 \times 10^{-6}/°$ C., whereas for aluminum oxide, the value is about $8 \times 10^{-6}/°$ C. This difference causes the aluminum oxide layer to be placed under stress during thermal cycling, and the phenomenon is exacerbated on non-flat surfaces. This is because during expansion, surface layers on areas of non-flat topography must expand more than they would expand on a flat surface. Stresses are therefore expected to be high at edges. During a temperature increase, for example, tensile stresses introduced to the oxide at an edge exceed the stresses which would be introduced to the oxide on a flat surface due to differences in thermal expansion coefficient alone.

It has been observed that cracking of a surface layer occurs on Type III anodized actively heated aluminum baffle components after thermal cycling during normal use of the plasma processing apparatus. Cracking is most visible along edges of such components. Any such cracking is a possible source of particulates within the chamber, so when cracking occurs, the cracked component must generally be replaced. This can increase the cost and degrade the quality of the plasma process. It is therefore desirable to have a surface finishing procedure for actively heated aluminum baffle components used in plasma processing chambers which generates reduced particles during wafer processing.

In light of the above-described disadvantages associated with using actively heated aluminum baffle components of Type III anodized aluminum in plasma processing chambers, further investigations have been conducted to develop components of different, more suitable, materials. As a result of these investigations, it has been discovered that actively heated aluminum baffle components which use alternative surface finishing techniques can be used without the above-mentioned disadvantages. According to a preferred embodiment, electropolishing is used to provide a layer of aluminum oxide to the surface of the components. Electropolished aluminum coupons show reduced cracking under conditions of thermal cycling over temperature ranges of at least 125° C., 150° C., 175° C., 200° C. or more.

Electropolishing is an electrochemical process in which the workpiece is immersed in a bath and is used as the anode (positive potential) in the electrochemical cell for electropolishing aluminum components. For electropolishing aluminum components, the bath contains concentrated phosphoric acid, and during the electropolishing process the bath is maintained at a temperature of about 50° C. to 70° C. for a duration of about 1-6 minutes in which a voltage of about 12-24V is applied. This treatment generally results in an oxide layer of thickness less than about 0.5 micrometers. The layer consists of primarily nonporous, high density aluminum oxide. Alumina layers produced by electropolishing are generally unpeelable. However, a primarily nonporous, high density, generally unpeelable aluminum oxide of thickness generally less than about 0.5 micrometers may be created by other suitable techniques if desired.

It is to be understood that an actively heated aluminum baffle component undergoing the following sequence may be either "new" or "used". If the component is an aluminum baffle plate ring or other component, then the aluminum baffle component can be a "new" baffle component that has not been used in a plasma chamber, or a "used" baffle component, i.e., a baffle component that has been previously used in a plasma chamber, and may be a bare aluminum component or a component which includes an aluminum oxide layer formed by electropolishing or other technique such as Type III anodization. Such "new" and "used" components are preferably treated to produce an aluminum oxide layer produced by electropolishing. Thus, "used" aluminum components can be "recovered" by removing a previously used baffle component from a plasma chamber, cleaning, stripping the oxide and electropolishing to provide an oxide layer resistant to cracking and particle formation when subjected to thermal cycling.

The following detailed example describes an electropolishing process applied for recovery of a used aluminum baffle component removed from a dual frequency parallel plate plasma etch chamber such as the 2300 Exelan™ dielectric etch system available from Lam Research Corporation. It is intended to be illustrative rather than exclusionary:

Example 1

According to a preferred embodiment, an aluminum baffle component removed from a plasma etch chamber is initially cleaned to remove deposits. Such deposits can include etch by-products such as carbon based polymers, as well as other substances, such as $AlF_3$. The cleaning preferably includes first using a suitable alkaline cleaning solution, such as Novaclean 120LF solution available from Henkel Surface Technologies located in Madison Heights, Mich. This solution is a non-silicated, alkaline cleaning solution containing sodium tetraborate and proprietary additives. The aluminum baffle component is preferably immersed in the solution for about 5 to about 15 minutes at a temperature of about 110° F. to about 130° F., followed by rinsing the aluminum baffle component with water for about 3 to about 5 minutes to remove the solution from it.

In the embodiment, the aluminum baffle component outer surface preferably is then etched using a suitable alkaline etching solution, such as Novax SC603B solution available from Henkel Surface Technologies. This solution is an alkaline etching solution containing primarily sodium hydroxide. The aluminum baffle component is preferably immersed in the solution for about 30 seconds to about 2 minutes at a temperature of about 110° F. to about 130° F., followed by rinsing with water for a sufficient amount of time to remove the solution from the aluminum baffle component, typically about 5 minutes to about 10 minutes. The rinsing water is preferably ultrapure water having a resistivity of at least about 15 Mohm-cm at about ambient temperature.

In the embodiment, the outer surface of the aluminum baffle component is then de-oxidized and cleaned of metals using a suitable deoxidizing solution, such as Nova 300A & B solution available from Henkel Surface Technologies. The aluminum baffle component is preferably immersed in the solution for a sufficient amount of time to remove the outer aluminum oxide layer from the aluminum baffle, typically from about 5 to about 10 minutes. The solution is preferably at about ambient temperature. The aluminum baffle component is then rinsed, preferably with ultrapure water, for a sufficient amount of time to remove the solution, typically about 5 to about 10 minutes. The rinsed aluminum baffle component is dried using, for example, clean dry air or filtered nitrogen.

After removing the aluminum oxide layer, the aluminum baffle component preferably is refinished to form a desired surface roughness for use in the etch chamber. For example, the refinished surface roughness can be less than about 0.4 micrometers. The aluminum baffle component can be refinished using any suitable abrasive, such as abrasive paper including an aluminum oxide abrasive, e.g., a 1200-grit abrasive paper. Coarser or finer abrasive paper can also, or alternatively, be used depending the desired surface finish of the aluminum baffle component. The aluminum baffle component can be rotated during resurfacing to enhance the uniformity of the surface finish. The resurfaced aluminum baffle component is rinsed, preferably using ultrapure water, for a sufficient amount of time to remove loose particles from the aluminum baffle component surface, typically about 5 to 10 minutes. The rinsed aluminum baffle component is dried using, for example, clean dry air or filtered nitrogen.

In the embodiment, contaminants remaining on the aluminum baffle component surface from the refinishing are removed; preferably first using a suitable alkaline cleaning solution, such as Novaclean 120LF. The aluminum baffle component is preferably soaked in the solution for about 5 to about 15 minutes at a temperature of about 110° F. to about 130° F. The aluminum baffle component is then rinsed, preferably with ultrapure water for about 3 to about 10 minutes, to remove residual alkaline cleaning solution from the aluminum baffle component.

After the alkaline cleaning step, the aluminum baffle component is cleaned with an acid cleaning solution to remove silicon and metal contaminants. A preferred acid cleaning solution contains a mixture of about 0.25% phosphoric acid and about 0.05% hydrofluoric acid. The aluminum baffle component is preferably immersed in an acid cleaning solution for about 1 to about 3 minutes at about ambient temperature. The aluminum baffle component is then rinsed, preferably with ultrapure water for about 3 to 10 minutes, to remove residual acid cleaning solution.

The aluminum baffle component is then electropolished in an electropolishing tank containing concentrated phosphoric acid such as Hydrite 1375 available from Hydrite Chemical Co. located in Brookfield, Wis. During the electropolishing process, the bath is maintained at a temperature of about 50° C. to 70° C. for a duration of 1-6 minutes in which a voltage of about 12-24V is applied. The aluminum baffle component is then preferably spray rinsed in deionized water for about 3 to about 10 minutes.

The aluminum baffle component is then moved to a clean environment, such as a class 10,000 or 1000 clean room, and spray rinsed in ultrapure water. This is followed by ultrasonic cleaning in ultrapure water for about 2-15 minutes at a power of 10-20 W/in$^2$ at 40 kHz. The aluminum baffle component is then dried, preferably using nitrogen or ultrapure air. The component is then placed in an oven at 120° C. for 30 minutes to remove water. After cooling, the component is packaged while still within the cleanroom.

The present invention has been described with reference to preferred embodiments. However, it will be readily apparent to those skilled in the art that it is possible to embody the invention in specific forms other than as described above without departing from the spirit of the invention. The preferred embodiment is illustrative and should not be considered restrictive in any way. The scope of the invention is given by the appended claims, rather than the preceding description, and all variations and equivalents which fall within the range of the claims are intended to be embraced therein.

What is claimed is:

1. An aluminum baffle component which can be actively heated when installed in a plasma processing chamber, the aluminum baffle component having an exposed outer aluminum oxide layer, wherein the outer aluminum oxide layer is formed by an electropolishing procedure and is a primarily non-porous aluminum oxide on the aluminum baffle component;
   wherein the component is at least one of a baffle ring and a thermal control plate.

2. The component of claim 1, wherein the outer aluminum oxide layer has a maximum thickness of about 0.5 microns.

3. The component of claim 1, wherein the component is made from an aluminum alloy.

4. The component of claim 1, wherein the component is made from Al 6061-T6.

5. The component of claim 1, wherein the component is either new or used.

6. A plasma processing apparatus, comprising:
   a plasma processing chamber including a showerhead electrode, a backing plate attached to the showerhead electrode, a thermal control plate attached to the backing plate, at least one heater on an upper surface of the thermal control plate; and
   an aluminum baffle component which can be actively heated when installed in a plasma processing chamber, the aluminum baffle component having an exposed outer aluminum oxide layer, wherein the outer aluminum oxide layer is formed by an electropolishing procedure and is a primarily non-porous aluminum oxide on the aluminum baffle component;
   wherein the baffle component comprises baffle rings located in plenums between the thermal control plate and the backing plate.

7. The plasma processing apparatus of claim 6, wherein the plasma processing apparatus comprises a plasma etch chamber wherein the baffle rings are thermally cycled between ambient and at least 100° C.

8. The plasma processing apparatus of claim 7, wherein the aluminum baffle component comprises the thermal control plate.

9. The plasma processing apparatus of claim 7, wherein the baffle ring is located in a plenum between the thermal control plate and the showerhead electrode.

10. An aluminum baffle component which can be actively heated when installed inside of a showerhead electrode assembly of a plasma processing chamber, the aluminum baffle component having an outer aluminum oxide layer which is formed by an electropolishing procedure, wherein the outer aluminum oxide layer is (i) primarily non-porous aluminum oxide, (ii) adjacent the aluminum baffle component and (iii) has an exposed outer surface;
  wherein the component is at least one of a baffle ring and a thermal control plate.

\* \* \* \* \*